(12) United States Patent
Benjamin et al.

(10) Patent No.: US 10,892,179 B2
(45) Date of Patent: *Jan. 12, 2021

(54) ELECTROSTATIC CHUCK INCLUDING CLAMP ELECTRODE ASSEMBLY FORMING PORTION OF FARADAY CAGE FOR RF DELIVERY AND ASSOCIATED METHODS

(71) Applicant: Lam Research Corporation, Fremont, CA (US)

(72) Inventors: Neil Martin Paul Benjamin, Palo Alto, CA (US); Henry Povolny, Newark, CA (US); Anthony J. Ricci, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 244 days.

This patent is subject to a terminal disclaimer.

(21) Appl. No.: 15/690,184

(22) Filed: Aug. 29, 2017

(65) Prior Publication Data
US 2018/0130689 A1    May 10, 2018

Related U.S. Application Data

(60) Provisional application No. 62/419,284, filed on Nov. 8, 2016.

(51) Int. Cl.
*H01L 21/683* (2006.01)
*H01J 37/32* (2006.01)

(52) U.S. Cl.
CPC .... *H01L 21/6833* (2013.01); *H01J 37/32082* (2013.01); *H01J 2237/334* (2013.01)

(58) Field of Classification Search
CPC .......... H01J 2237/334; H01J 37/32082; H01L 21/6833
See application file for complete search history.

(56) References Cited

U.S. PATENT DOCUMENTS

| | | | | |
|---|---|---|---|---|
| 6,303,879 | B1* | 10/2001 | Burkhart | C04B 37/026 174/261 |
| 2001/0024349 | A1* | 9/2001 | Shamoulian | H02N 13/00 361/234 |
| 2005/0041364 | A1* | 2/2005 | Kellerman | H01L 21/6833 361/234 |
| 2013/0114181 | A1* | 5/2013 | Drewery | H01L 21/6833 361/234 |

* cited by examiner

*Primary Examiner* — Hua Qi
(74) *Attorney, Agent, or Firm* — Penilla IP, APC

(57) ABSTRACT

A ceramic layer is attached to a top surface of a base plate using a bond layer. The ceramic layer has a top surface configured to support a substrate. A clamp electrode assembly is positioned within an upper region of the ceramic layer. The clamp electrode assembly serves to clamp the substrate to the top surface of the ceramic layer and functions as a primary radiofrequency (RF) power delivery electrode. A plurality of RF power delivery connection modules is distributed in a substantially uniform manner about a perimeter of the ceramic layer. Each of the RF power delivery connection modules is configured to form an electrical connection from the base plate to the clamp electrode assembly at its respective location.

18 Claims, 13 Drawing Sheets

View A-A

View A-A

View A-A

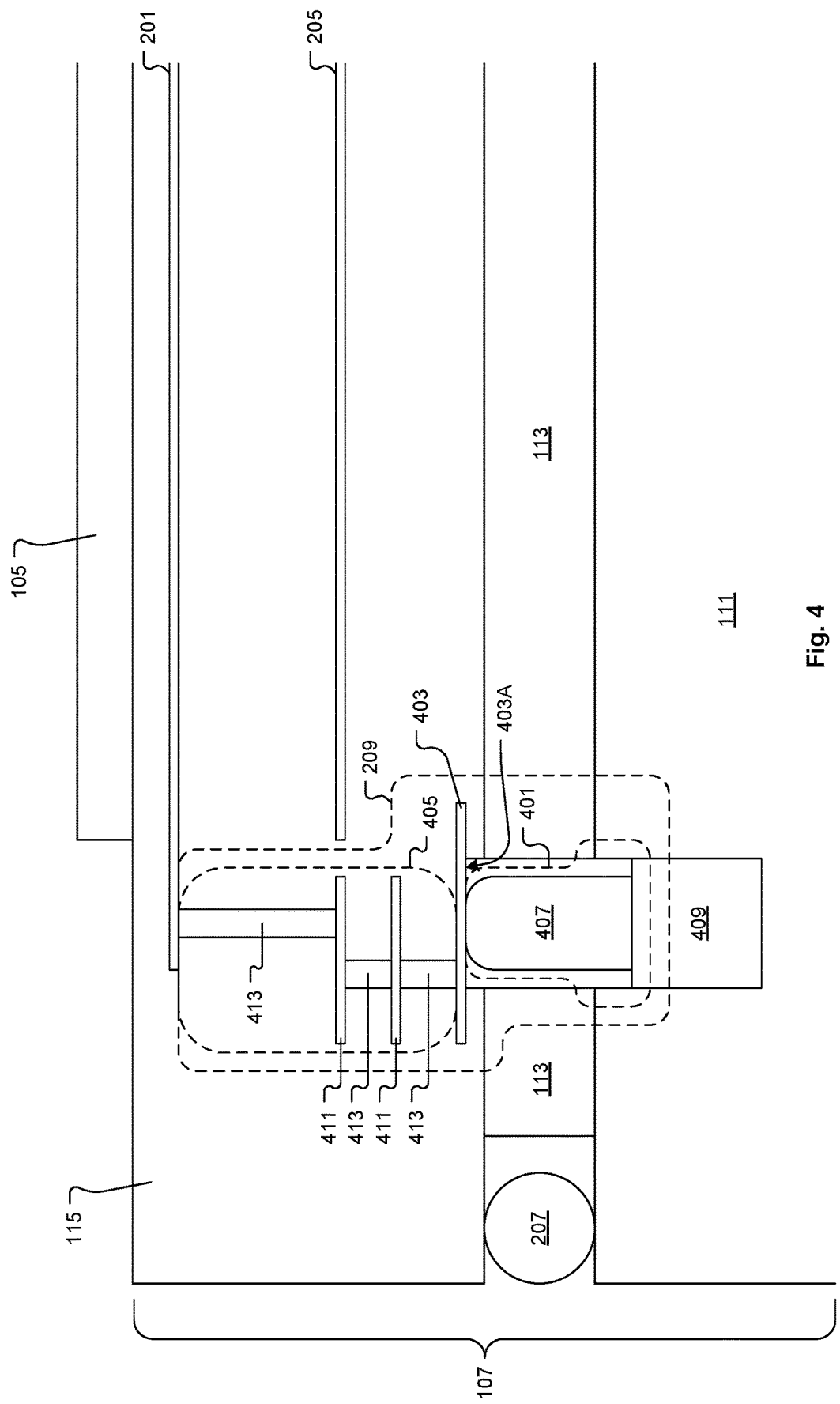

701

Form ceramic layer having a top surface including an area configured to support a substrate by:
    positioning a clamp electrode assembly within the ceramic layer in an orientation substantially parallel to the top surface of the ceramic layer and at an upper location within the ceramic layer such that a region of the ceramic layer between the clamp electrode assembly and the top surface of the ceramic layer is free of other electrically conductive material, wherein the clamp electrode assembly is configured to extend horizontally through the ceramic layer to at least span an area underlying the area of the top surface of the ceramic layer that is configured to support the substrate,
    positioning a plurality of RF power delivery connection modules in a substantially uniformly distributed manner about a perimeter of the ceramic layer, each of the plurality of RF power delivery connection modules configured to form an electrical connection from a base plate to the clamp electrode assembly at its respective location so as to form an RF power transmission path from the base plate to the clamp electrode assembly at its respective location.

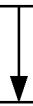

703

Attach the ceramic layer to the base plate using a bond layer disposed between the base plate and the ceramic layer.

Fig. 7

ELECTROSTATIC CHUCK INCLUDING CLAMP ELECTRODE ASSEMBLY FORMING PORTION OF FARADAY CAGE FOR RF DELIVERY AND ASSOCIATED METHODS

CLAIM OF PRIORITY

This application claims priority under 35 U.S.C. 119(e) to U.S. Provisional Patent Application No. 62/419,284, filed Nov. 8, 2016, the disclosure of which is incorporated herein by reference in its entirety for all purposes.

CROSS-REFERENCE TO RELATED APPLICATIONS

This application is related to the following applications:
U.S. Provisional Application 62/197,253, filed on Jul. 27, 2015
U.S. Non-Provisional application Ser. No. 15/170,295, filed on Jun. 1, 2016, issued as U.S. Pat. No. 9,673,025, on Jun. 6, 2017
U.S. Non-Provisional application Ser. No. 15/607,147, filed on May 26, 2017
U.S. Non-Provisional application Ser. No. 15/628,528, filed on Jun. 20, 2017
U.S. Provisional Application 62/419,299, filed on Nov. 8, 2016.

The disclosure of each above-identified application and patent is incorporated herein by reference in its entirety for all purposes.

BACKGROUND

1. Field of the Invention

The present invention relates to semiconductor device fabrication.

2. Description of the Related Art

Many modern semiconductor chip fabrication processes are performed within a plasma processing chamber in which a substrate, e.g., wafer, is supported on an electrostatic chuck. In some cases, radiofrequency (RF) signals are transmitted through the electrostatic chuck to provide for generation and/or RF biasing of a plasma within a region overlying the electrostatic chuck. The RF signals are generally transmitted to the bottom of the electrostatic chuck and flow through the internal structure of the electrostatic chuck by capacitive coupling to reach the region overlying the electrostatic chuck. The internal structure of the electrostatic chuck can vary between different electrostatic chucks, thereby introducing variation in the transmission of the RF signals through different electrostatic chucks. Also, the internal structure of the electrostatic chuck can vary azimuthally, thereby causing azimuthal non-uniformity in the transmission of the RF signals through the electrostatic chuck.

SUMMARY

In an example embodiment, an electrostatic chuck is disclosed. The electrostatic chuck includes a base plate formed of an electrically conductive material. The electrostatic chuck also includes a ceramic layer attached to a top surface of the base plate using a bond layer disposed between the base plate and the ceramic layer. The ceramic layer has a top surface that includes an area configured to support a substrate. The electrostatic chuck includes a clamp electrode assembly positioned within the ceramic layer in an orientation substantially parallel to the top surface of the ceramic layer and at an upper location within the ceramic layer such that a region of the ceramic layer between the clamp electrode assembly and the top surface of the ceramic layer is substantially free of other electrically conductive material. The clamp electrode assembly is configured to extend horizontally through the ceramic layer to at least span an area underlying the area of the top surface of the ceramic layer that is configured to support the substrate. The electrostatic chuck also includes a plurality of RF power delivery connection modules distributed in a substantially uniform manner about a perimeter of the ceramic layer. Each of the plurality of RF power delivery connection modules is configured to form an electrical connection from the base plate to the clamp electrode assembly at its respective location so as to form an RF power transmission path from the base plate to the clamp electrode assembly at its respective location. The base plate, the plurality of RF power delivery connection modules, and the clamp electrode assembly together form a Faraday cage to direct RF power transmission around an internal volume of the electrostatic chuck.

In an example embodiment, a system for plasma processing is disclosed. The system includes a processing chamber and an electrostatic chuck positioned within the processing chamber. The electrostatic chuck includes a base plate formed of an electrically conductive material. The electrostatic chuck also includes a ceramic layer attached to a top surface of the base plate using a bond layer disposed between the base plate and the ceramic layer. The ceramic layer has a top surface including an area configured to support a substrate. The electrostatic chuck also includes a clamp electrode assembly positioned within the ceramic layer in an orientation substantially parallel to the top surface of the ceramic layer and at an upper location within the ceramic layer such that a region of the ceramic layer between the clamp electrode assembly and the top surface of the ceramic layer is substantially free of other electrically conductive material. The clamp electrode assembly is configured to extend horizontally through the ceramic layer to at least span an area underlying the area of the top surface of the ceramic layer that is configured to support the substrate. The electrostatic chuck also includes a plurality of RF power delivery connection modules distributed in a substantially uniform manner about a perimeter of the ceramic layer. Each of the plurality of RF power delivery connection modules is configured to form an electrical connection from the base plate to the clamp electrode assembly at its respective location so as to form an RF power transmission path from the base plate to the clamp electrode assembly at its respective location. The system also includes an RF power source connected to transmit RF power to the base plate of the electrostatic chuck. The base plate, the plurality of RF power delivery connection modules, and the clamp electrode assembly of the electrostatic chuck together form a Faraday cage to direct RF power transmission around an internal volume of the electrostatic chuck.

In an example embodiment, a method is disclosed for manufacturing an electrostatic chuck. The method includes forming a ceramic layer having a top surface including an area configured to support a substrate. Forming the ceramic layer includes positioning a clamp electrode assembly within the ceramic layer in an orientation substantially parallel to the top surface of the ceramic layer and at an upper location within the ceramic layer such that a region of the ceramic layer between the clamp electrode assembly and the top surface of the ceramic layer is substantially free of other electrically conductive material. The clamp electrode assembly is configured to extend horizontally through the ceramic layer to at least span an area underlying the area of the top surface of the ceramic layer that is configured to support the substrate. Forming the ceramic layer also includes positioning a plurality of RF power delivery connection modules in a substantially uniformly distributed manner about a perimeter of the ceramic layer. Each of the plurality of RF power delivery connection modules is configured to form an electrical connection from a base plate to the clamp electrode assembly at its respective location so as to form an RF power transmission path from the base plate to the clamp electrode assembly at its respective location. The method also includes attaching the ceramic layer to the base plate using a bond layer disposed between the base plate and the ceramic layer. The base plate, the plurality of RF power delivery connection modules, and the clamp electrode assembly together form a Faraday cage to direct RF power transmission around an internal volume of the electrostatic chuck.

BRIEF DESCRIPTION OF THE DRAWINGS

FIG. 4 shows a vertical cross-section view through one of the plurality of RF power delivery connection modules, in accordance with some embodiments of the present invention.

FIG. 7 shows a flowchart of a method for manufacturing an electrostatic chuck, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
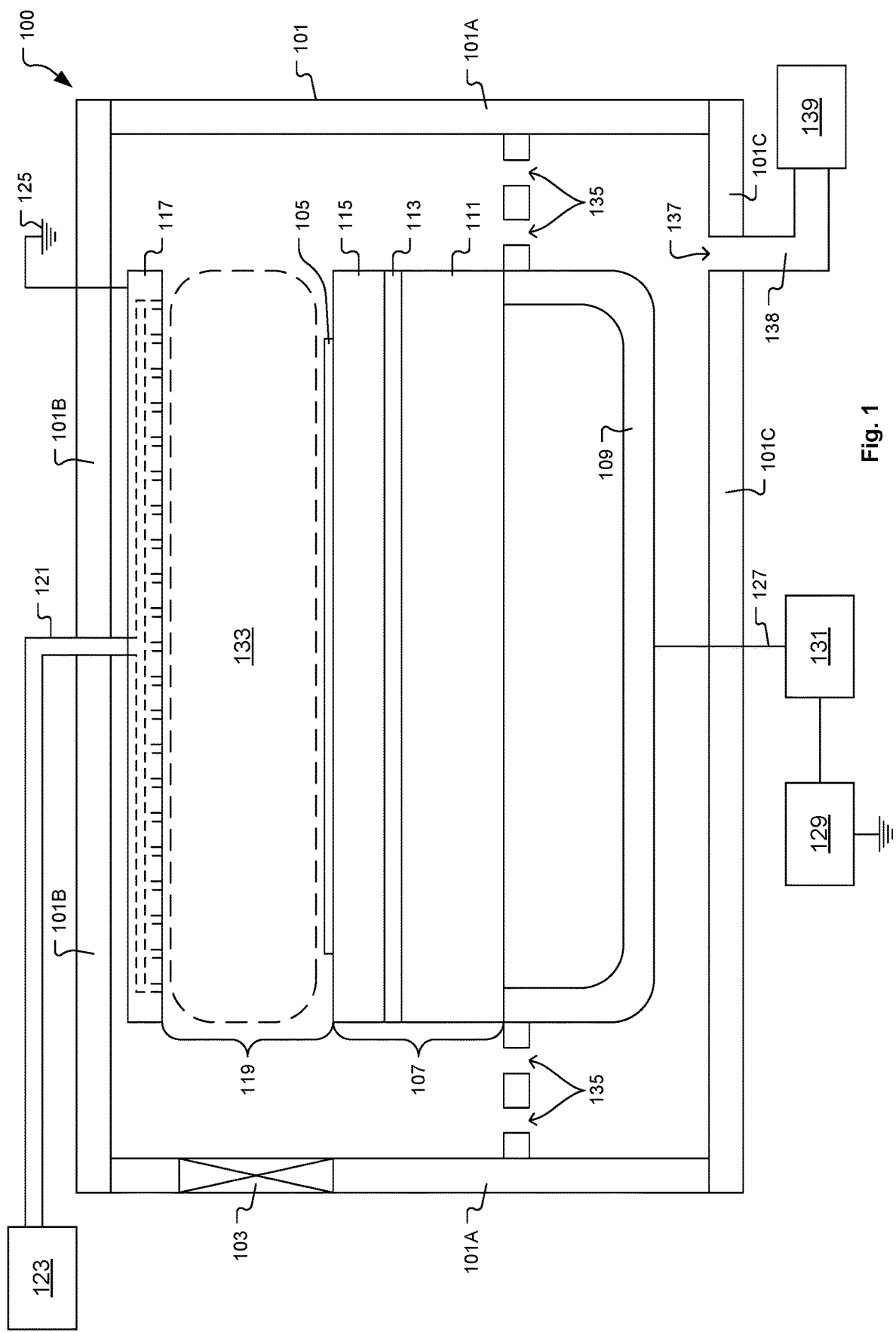
FIG. 1 shows system for plasma processing that includes a plasma processing chamber, in accordance with some embodiments of the present invention.

FIG. 1 shows a system for plasma processing that includes a plasma processing chamber 100, in accordance with some embodiments of the present invention. The plasma processing chamber 100 includes an exterior structure 101 defined by one or more side walls 101A, a top structure 101B, and a bottom structure 101C. In some embodiments, the exterior structure 101 of the plasma processing chamber 100 can be formed of an electrically conductive material and have an electrical connection to a reference ground potential. In some embodiments, the plasma processing chamber 100 can include a closable entryway 103 through which a substrate 105 can be inserted into and removed from the plasma processing chamber 100. In other embodiments, an upper portion of the processing chamber 100 can be configured to separate from a lower portion of the process chamber 100 to enable insertion and removal of the substrate 105.

The plasma processing chamber includes an electrostatic chuck 107 disposed on a lower support structure 109. The electrostatic chuck 107 includes a base plate 111, a bond layer 113, and a ceramic layer 115. In some embodiments, the base plate 111 is formed of aluminum. However, in other embodiments, the base plate 111 can be formed of other materials or combinations of materials, so long as the base plate 111 provides sufficient electrical conduction, thermal conduction, and mechanical strength to support operation of the electrostatic chuck 107. The bond layer 113 secures the ceramic layer 115 to the base plate 111. The bond layer 113 also acts as a thermal break between the ceramic layer 115 and the base plate 111. A top surface of the ceramic layer 115 includes an area configured to support the substrate 105 during processing. In some embodiments, the top surface of the ceramic layer 115 is formed by co-planar top surfaces of multiple raised structures referred to as mesa structures. With the substrate 105 supported on the top surfaces of the mesa structures, the regions between the sides of the mesa structures provide for flow of a fluid, such as helium gas, against the backside of the substrate 105 to provide for enhanced temperature control of the substrate 105.

The plasma processing chamber 100 further includes a top electrode 117 disposed over the electrostatic chuck 107, such that a plasma processing region 119 exists between the electrostatic chuck 107 and the top electrode 117. In some embodiments, the top electrode 117 is electrically connected to a reference ground potential 125. A process gas supply line 121 is plumbed to supply a process gas from a process gas source 123 to the plasma processing region 119. In some embodiments, the process gas supply line 121 is configured to simply dispense the process gas at one or more locations within the plasma processing chamber 100. In some embodiments, the top electrode 117 is defined as a showerhead electrode including a number of internal flow channels leading to a number of dispense ports, with the process gas supply line 121 plumbed to an input of the showerhead electrode so that the process gas can be flowed through the number of internal flow channels to the number of dispense ports and into the plasma processing region 119 in a distributed manner.

An RF power source 129 is connected to supply RF signals through a matching module 131 to a connection 127, with the connection 127 configured to transmit the supplied RF signals to the lower support structure 109. During operation, the process gas is flowed into the plasma processing region 119, and the RF signals are supplied to the lower support structure 109. The RF signals are transmitted from the lower support structure to the base plate 111, and from the base plate 111 through the electrostatic chuck 107, and through the plasma processing region 119 to the top electrode 117. The RF signals transform the process gas within the plasma processing region 119 into a plasma 133 in exposure to the substrate 105, whereby reactive constituents of the plasma 133, such as ions and/or radicals, operate to modify exposed portions of the substrate 105. In some embodiments, gases within the processing chamber 100 flow from the plasma processing region 119 through side vents 135 to an exhaust port 137, which is plumbed through a connection 138 to an exhaust module 139 configured to draw fluids from the internal volume of the processing chamber 100.

It should be understood that the plasma processing chamber 100 is presented herein in a simplified manner for ease of description. In reality, the plasma processing chamber 100 is a complex system that includes many components not described herein. However, what should be appreciated for the present discussion is that the plasma processing chamber 100 is connected to receive controlled flows of one or more process gas composition(s) under carefully controlled conditions and includes the electrostatic chuck 107 for holding the substrate 105, where the electrostatic chuck 107 is connected to transmit RF signals to the plasma processing region 119 to transform the one or more process gas composition(s) into the plasma 133 to enable processing of the substrate 105 in a specified manner and/or for RF biasing of the plasma 133 within the plasma processing region 119 overlying the electrostatic chuck 107. Examples of plasma processing operations that may be performed by the plasma processing chamber 100 include etching operations, deposition operations, and ashing operations, among others.

The plasma processing chamber 100 is an example of a type of capacitively coupled plasma (CCP) processing chamber that utilizes the electrostatic chuck 107. It should be understood, however, that the electrostatic chuck 107 can be utilized in other types of plasma processing chambers, such as inductively coupled plasma (ICP) processing chambers and transformer coupled plasma (TCP) processing chambers, in which RF signals may be transmitted from the electrostatic chuck 107 to a plasma processing region above a substrate held by the electrostatic chuck 107. The disclosure herein primarily concerns improvements in the design and operation of the electrostatic chuck 107. Therefore, it should be understood that the various example embodiments of the electrostatic chuck 107 disclosed herein can be utilized with essentially any type of plasma processing chamber, with the plasma processing chamber 100 of FIG. 1 providing an example for discussion purposes.

In an example embodiment, the term substrate 105 as used herein refers to a semiconductor wafer. However, it should be understood that in other embodiments, the term substrate 105 as used herein can refer to substrates formed of sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 as referred to herein may correspond to a 200 mm (millimeters) semiconductor wafer, a 300 mm semiconductor wafer, or a 450 mm semiconductor wafer. Also, in some embodiments, the substrate 105 as referred to herein may correspond to a non-circular substrate, such as a rectangular substrate for a flat panel display, or the like, among other shapes.

Figure 2A:
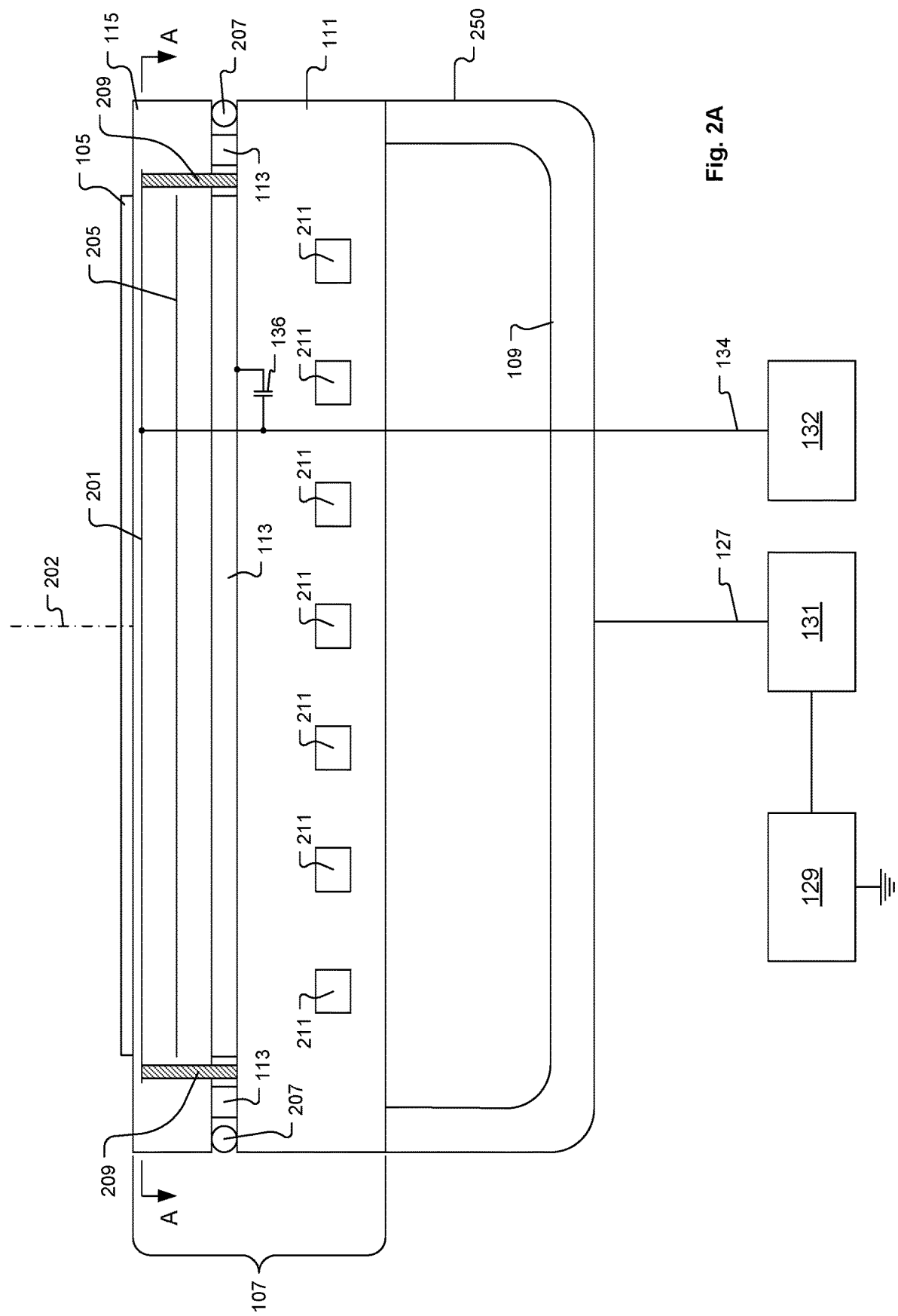
FIG. 2A shows the electrostatic chuck with the ceramic layer configured to include a clamp electrode assembly and one or more resistance heaters, in accordance with some embodiments of the present invention.

FIG. 2A shows the electrostatic chuck 107 with the ceramic layer 115 configured to include a clamp electrode assembly 201 and one or more resistance heaters 205, in accordance with some embodiments of the present invention. In some embodiments, the clamp electrode assembly 201 can have a single electrode configured for monopolar operation to generate an electrical field for holding the substrate 105 on the top surface of the ceramic layer 115. For monopolar operation of the clamp electrode assembly 201, direct current isolation from the base plate 111 is optional.

In some embodiments, the clamp electrode assembly 201 can include two separate clamp electrodes configured for bipolar operation in which a differential voltage is applied between the two separate clamp electrodes to generate an electrical field for holding the substrate 105 on the top surface of the ceramic layer 115. In various embodiments, the two separate clamp electrodes can be geometrically interdigitated or interleaved to enable the bipolar operation. Also, in some embodiments, the clamp electrode assembly 201 can include three or more separate clamp electrodes connected to operate in a multiphasic manner. Each of the one or more clamp electrode(s) in the claim electrode assembly 201 is connected to a DC voltage supply 132 through a connection 134.

For bipolar operation of the clamp electrode assembly 201, direct current isolation from the base plate 111 is necessary. In some embodiments, coupling capacitors can be provided for this purpose. In some embodiments, one or more capacitors 136 can be electrically connected between the one or more clamp electrodes(s) of the clamp electrode assembly 201 and the base plate 111 to provide for filtering of RF signals. The DC voltage supply 132 is configured to control a voltage present on the one or more clamp electrode(s) of the clamp electrode assembly 201. In the embodiments in which the clamp electrode assembly 201 includes multiple clamp electrodes, each of the multiple clamp electrodes is connected to the DC voltage supply 132 (or to separate DC voltage supplies 132, respectively), such that its voltage and/or phase is controlled in an independent manner relative to others of the multiple clamp electrodes of the clamp electrode assembly 201. In some embodiments, the capacitors 136 can be disposed within the electrostatic chuck 107. In other embodiments, particularly where the capacitors 136 are of larger size, the capacitors 136 can be mounted external to the electrostatic chuck 107. The size of the capacitors 136 will depend on the clamp voltage, the RF current, and the number of connections between the base plate 111 and the clamp electrodes of the clamp electrode assembly 201.

In some embodiments, the electrostatic chuck 107 includes a perimeter seal 207 disposed between a bottom surface of the ceramic layer 115 and a top surface of the base plate 111 outside a radial perimeter of the bond layer 113. The perimeter seal 207 is configured to prevent entry of plasma 133 constituents and/or process by-product materials to interior regions at which the ceramic layer 115 and base plate 111 interface with the bond layer 113.

In various embodiments, the electrostatic chuck 107 can be configured to include various cooling mechanisms, heating mechanisms, clamping mechanisms, bias electrodes, substrate lifting pins, and sensors, where the sensors can provide for measurement of temperature, pressure, electrical voltage, and/or electrical current, among other parameters. For example, the base plate 111 can be configured to include a number of cooling channels 211 through which a cooling fluid can be flowed. Also, the ceramic layer 115 can include an arrangement of fluid flow channels through which a backside gas can be flowed and dispensed into the region between the mesa structures underlying the substrate 105. It should be appreciated that the lower support structure 109 can be configured to hold various circuitry, plumbing, control components, and supporting parts for the internal components of the electrostatic chuck 107, such as for the resistance heater(s) 205, backside gas delivery system, substrate lifting pins, clamp electrode assembly 201, cooling channels 211, sensors, etc.

For high frequency RF power applications, e.g., RF frequencies of about 1 MHz and greater, the clamp electrode assembly 201 is relied upon to distribute the RF signals to the plasma processing region 119. In some cases, the RF signals may be applied to the base plate 111 with reliance upon capacitive coupling of the RF signals through the interior regions of the electrostatic chuck 107 to the clamp electrode assembly 201 and ultimately to the plasma processing region 119. However, there are difficulties associated with transmitting RF signals through the interior regions of the electrostatic chuck 107. For example, with transmission of RF signals through the interior regions of the electrostatic chuck 107, there is a possibility of striking an unwanted (parasitic) plasma within various interior regions of the electrostatic chuck 107 which could cause damage and/or de-chucking of the substrate 105. Also, RF signals transmitted through the interior regions of the electrostatic chuck 107 can couple through elements of the resistance heater(s) 205, which can cause non-uniformity in the RF current distribution reaching the plasma processing region 119, and in turn adversely affect process uniformity, e.g., etch uniformity and critical dimension uniformity. Additionally, RF signals transmitted through the interior regions of the electrostatic chuck 107 can damage various circuitry therein, such as drive circuits of the resistance heater(s) 205, among other circuitry. And, with lower frequency RF power applications, e.g., RF frequencies of less than about 1 MHz, the electrostatic chuck 107 appears as a high impedance insulator to the RF signals. Therefore, in lower frequency RF power applications, it is difficult to rely on transmission of lower frequency RF signals from the base plate 111 through the ceramic layer 115 to the plasma processing region 119 without including parallel coupling mechanisms, such as external capacitors.

To remedy the issues associated with transmission of RF signals through the electrostatic chuck 107, some embodiments are disclosed herein in which electrical connections are made between the base plate 111 and the one or more clamp electrodes of the clamp electrode assembly 201. In these embodiments, the electrostatic chuck 107 operates as a parallel plate capacitor, with the one or more clamp electrodes of the clamp electrode assembly 201 acting as one plate and with the ceramic layer 115 acting as an insulator and with the substrate 105 acting as another other plate. In some embodiments, if this configuration does not provide sufficient intrinsic capacitance, additional supplemental capacitance can be installed to reach a desired capacitance level. In this configuration, RF current is capacitively coupled to the substrate 105 from the one or more clamp electrode(s) of the clamp electrode assembly 201 through the ceramic layer 115. Also, in this configuration, electrical connections between the base plate 111 and the one or more clamp electrode(s) of the clamp electrode assembly 201 are configured in size and number to tolerate the applied RF current, so as to avoid damage of these electrical connections and a corresponding failure of the clamp electrode assembly 201 to hold the substrate 105. It should be understood that with the electrical connections between the base plate 111 and the one or more clamp electrode(s) of the clamp electrode assembly 201 present within the electrostatic chuck 107, it is not necessary to transmit RF signals through problematic interior regions of the electrostatic chuck 107. Therefore, it should be appreciated that the electrical connections between the base plate 111 and the one or more clamp electrode(s) of the clamp electrode assembly 201 provide for safe and reliable delivery of RF signals to the plasma processing region 119 across a broad spectrum of lower and higher RF signal frequencies.

With reference back to FIG. 2A, the one or more clamp electrode(s) of the clamp electrode assembly 201 is/are positioned within the ceramic layer 115 in an orientation substantially parallel to the top surface of the ceramic layer 115 and at an upper location within the ceramic layer 115, such that a region of the ceramic layer 115 between the clamp electrode assembly 201 and the top surface of the ceramic layer 115 is substantially free of other electrically conductive material. Also, the clamp electrode assembly 201 is configured to extend horizontally through the ceramic layer 115 to at least span an area underlying the area of the top surface of the ceramic layer 115 that is configured to support the substrate 105. The clamp electrode assembly 201 is placed near the top of the ceramic layer 115 to optimize reactive capacitance and to minimize interference with the electrical field emanating from the clamp electrode assembly 201.

In some embodiments, the region of the ceramic layer 115 between the one or more clamp electrode(s) of the clamp electrode assembly 201 and the top surface of the ceramic layer 115 being substantially free of other electrically conductive material corresponds to this region including no electrically conductive material. In some embodiments, the region of the ceramic layer 115 between the one or more clamp electrode(s) of the clamp electrode assembly 201 and the top surface of the ceramic layer 115 being substantially free of other electrically conductive material corresponds to this region including sparsely distributed electrically conductive material that does not interfere with transmission of RF signals. In some embodiments, the region of the ceramic layer 115 between the one or more clamp electrode(s) of the clamp electrode assembly 201 and the top surface of the ceramic layer 115 being substantially free of other electrically conductive material corresponds to this region including some electrically conductive material that is electrically isolated from other surrounding electrically conductive materials, i.e., electrically floating. In some embodiments, the region of the ceramic layer 115 between the one or more clamp electrode(s) of the clamp electrode assembly 201 and the top surface of the ceramic layer 115 being substantially free of other electrically conductive material corresponds to this region including electrically conductive material of a thickness small enough to not shield RF signals.

In various embodiments, the one or more clamp electrode(s) of the clamp electrode assembly 201 is formed of molybdenum, tantalum, tungsten, palladium, ruthenium, platinum, among others. It should be understood, however, that the one or more clamp electrode(s) of the clamp electrode assembly 201 can be formed of essentially any electrically conductive material, so long as the one or more clamp electrode(s) of the clamp electrode assembly 201 is/are capable of functioning as a conductor of RF signals of a required frequency and satisfies the mechanical and thermal requirements associated with manufacturing and operation. In some embodiments, a thickness of the one or more clamp electrode(s) of the clamp electrode assembly 201 is about two to three times a skin depth for RF signal transmission at an applied RF signal frequency. As an example, the skin depth for RF signal transmission at an applied RF signal frequency of 13.56 MHz is about 0.0007 inch. As another example, the skin depth for RF signal transmission at an applied RF signal frequency of 400 kHz is about 0.004 inch. In some embodiments, the thickness of the one or more clamp electrode(s) of the clamp electrode assembly 201 is within a range extending from about 0.005 inch to about 0.015 inch. However, it should be understood that in other embodiments, the thickness of the one or more clamp electrode(s) of the clamp electrode assembly 201 can be either less than 0.005 inch or greater than 0.015 inch. Also, in some embodiments, the one or more clamp electrode(s) of the clamp electrode assembly 201 is/are formed by applying, e.g., laminating, co-firing, etc., a metallic foil during fabrication of the ceramic layer 115. And, in some embodiments, during fabrication of the ceramic layer 115, the one or more clamp electrode(s) of the clamp electrode assembly 201 is/are formed using a screen printing process in which an ink is formulated to contain the metal material that forms the one or more clamp electrode(s) of the clamp electrode assembly 201. However, it should be understood that in other embodiments, different methods and techniques can be used to form the one or more clamp electrode(s) of the clamp electrode assembly 201.

To provide for electrical connection of the one or more clamp electrode(s) of the clamp electrode assembly 201 to the base plate 111, a plurality of RF power delivery connection modules 209 are distributed in a substantially uniform manner about a perimeter of the ceramic layer 115, with each of the plurality of RF power delivery connection modules 209 providing a low impedance transmission path for RF signals between the base plate 111 and the one or more clamp electrode(s) of the clamp electrode assembly 201. Each of the plurality of RF power delivery connection modules 209 is configured to form an electrical connection from the base plate 111 to a given clamp electrodes of the clamp electrode assembly 201 at its respective location so as to form an RF power transmission path from the base plate 111 to the given clamp electrode of the clamp electrode assembly 201 at its respective location.

Figure 3A:
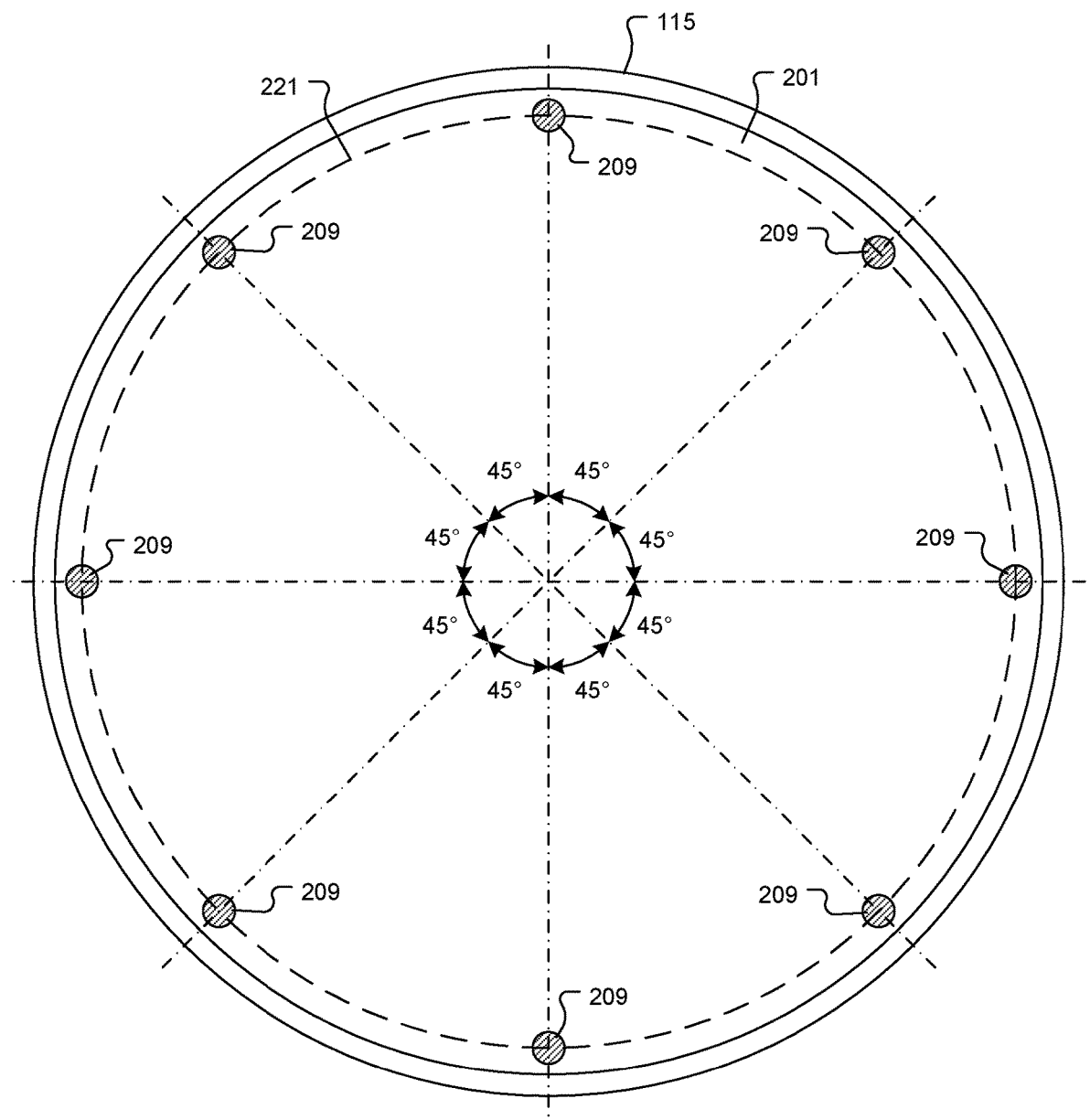
FIG. 3A shows a horizontal cross-section view of the electrostatic chuck extending through the interface between clamp electrode assembly and the plurality of RF power delivery connection modules, corresponding to View A-A as referenced in FIG. 2A, in accordance with some embodiments of the present invention.

FIG. 3A shows a horizontal cross-section view of the electrostatic chuck 107 extending through the interface between the clamp electrode assembly 201 and the plurality of RF power delivery connection modules 209, corresponding to View A-A as referenced in FIG. 2A, in accordance with some embodiments of the present invention. In the example of FIG. 3A, there are eight RF power delivery connection modules 209 distributed in a substantially even manner about the perimeter of the ceramic layer 115 and near a periphery of the ceramic layer 115 along a circumference 221 about the ceramic layer 115, with each of the eight RF power delivery connection modules 209 separated from each adjacent one of the eight RF power delivery connection modules 209 by an angle of about 45 degrees as measured about a centerline 202 of the ceramic layer 115 extending perpendicular to the top surface of the ceramic layer 115. In other embodiments, more than or less than eight RF power delivery connection modules 209 can be used. For instance, another example embodiment can include up to 1000 RF power delivery connection modules 209.

Figure 3B:
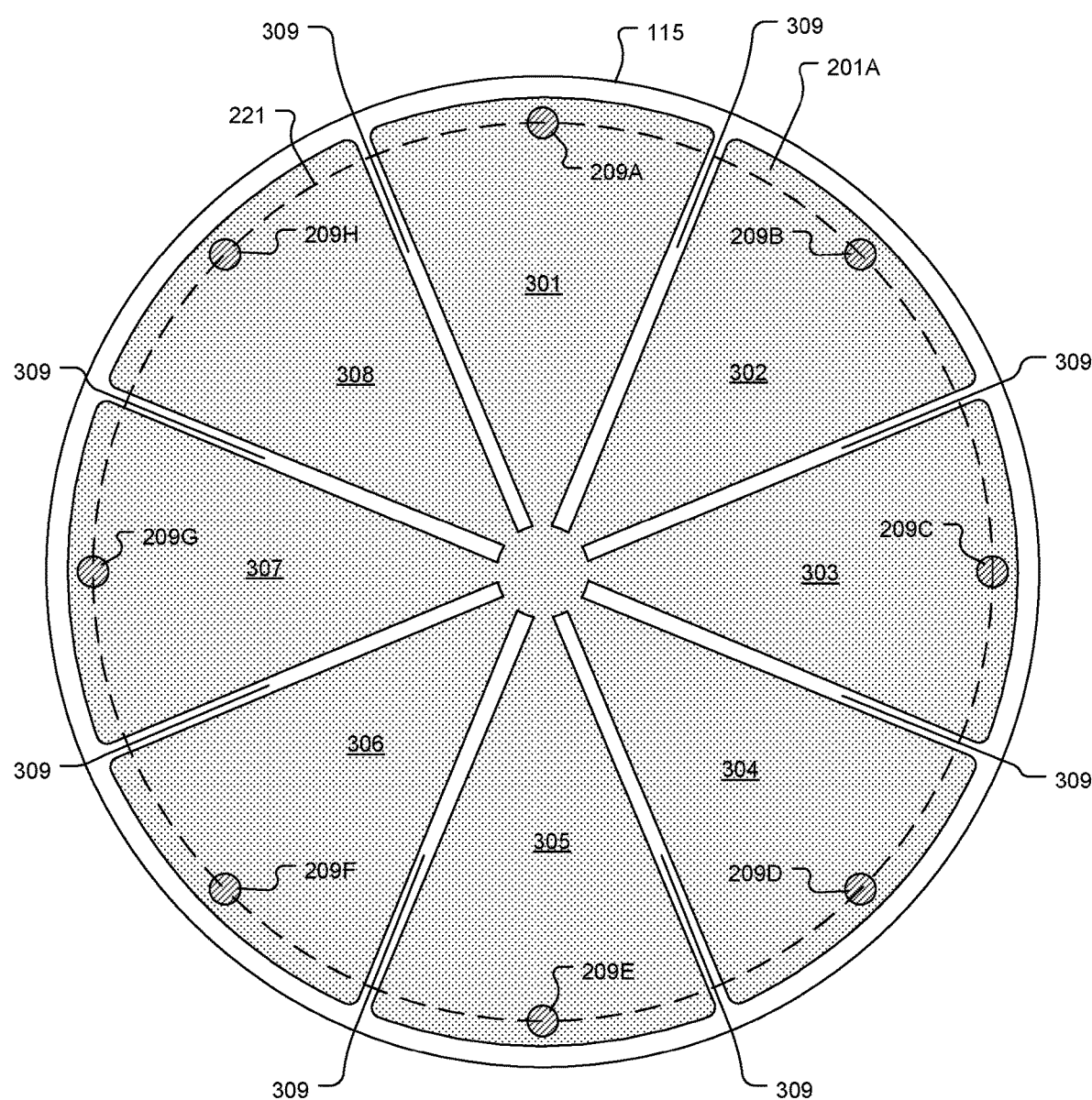
FIG. 3B shows a modified version of the clamp electrode assembly of FIG. 3A, in which the clamp electrode assembly is sectioned in a radially symmetric manner about the centerline of the ceramic layer, in accordance with some embodiments of the present invention.

Also, for some high frequency applications, e.g., 60 MHz or greater, for uniformity reasons, it may be desirable for the clamp electrode assembly 201 to have a sectioned shape, such as with petals. FIG. 3B shows a modified version of the clamp electrode assembly 201 of FIG. 3A, in which a monopolar clamp electrode 201A of the clamp electrode assembly 201 is interrupted in a radially symmetric manner about the centerline 202 of the ceramic layer 115, in accordance with some embodiments of the present invention. In the example embodiment of FIG. 3B, gaps 309 separate adjacent regions 301-308 of the monopolar clamp electrode 201A of the clamp electrode assembly 201, and each region 301-308 of the monopolar clamp electrode 201A of the clamp electrode assembly 201 is connected together near the centerline 202 of the ceramic layer 115. Also, each region 301-308 of the monopolar clamp electrode 201A of the clamp electrode assembly 201 is connected to receive RF power from the base plate 111 through a respective one of the plurality of RF power delivery connection modules 209A-209H, respectively.

Figure 3C:
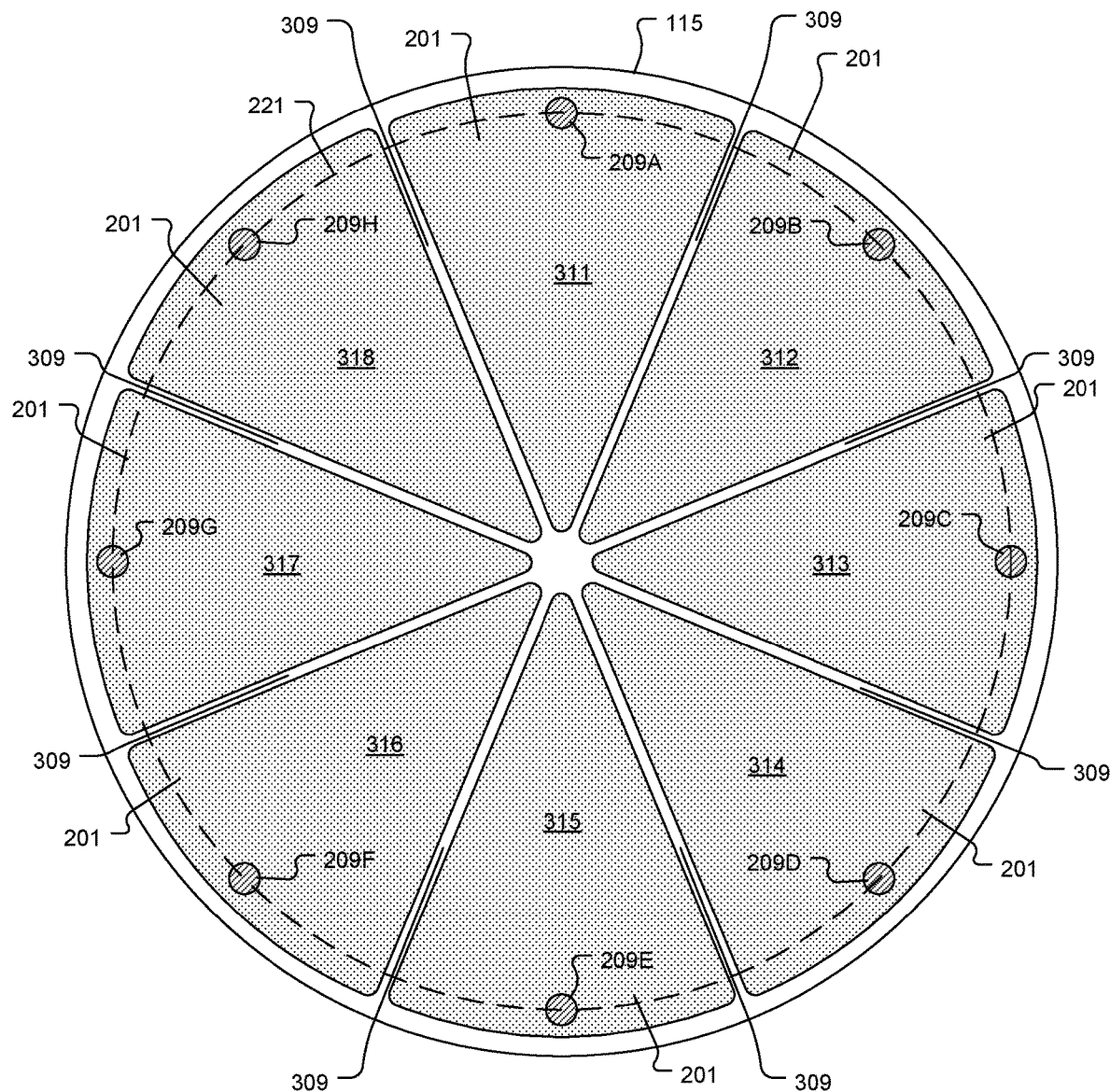
FIG. 3C shows a modified version of the clamp electrode assembly of FIG. 3A, in which the clamp electrode assembly is sectioned in a radially symmetric manner about the centerline of the ceramic layer, in accordance with some embodiments of the present invention.

FIG. 3C shows a modified version of the clamp electrode assembly 201 of FIG. 3A, in which the clamp electrode assembly 201 includes multiple clamp electrodes 311-318 positioned in a radially symmetric manner about the centerline 202 of the ceramic layer 115, in accordance with some embodiments of the present invention. In the example embodiment of FIG. 3C, adjacent ones of the clamp electrode 311-318 are separated from each other by gaps 319. Also, each clamp electrode 311-318 of the clamp electrode assembly 201 is connected to receive RF power from the base plate 111 through a respective one of the plurality of RF power delivery connection modules 209A-209H, respectively. In some embodiments, each of the plurality of RF power delivery connection modules 209A-209H can be connected to receive separately controlled RF signals, such that RF signal transmission through each clamp electrode 311-318 of the clamp electrode assembly 201 can be independently controlled. Also, each clamp electrode 311-318 can be connected to receive an independently controlled clamping voltage, such that the clamp electrode assembly 201 operated in a bipolar mode. For example, clamp electrodes 311, 313, 315, and 317 can be connected to receive a positive voltage of a given magnitude, and clamp electrodes 312, 314, 316, and 318 can be connected to receive a negative voltage of the given magnitude.

To provide for uniform transmission of the RF signals from the base plate 111 to the one or more clamp electrode(s) of the clamp electrode assembly 201, the plurality of RF power delivery connection modules 209 can be distributed in a substantially uniform manner about the centerline 202 of the ceramic layer 115. However, some adjustments in locations of the plurality of RF power delivery connection modules 209 can be made in order to accommodate their placement around other structures and/or passages within the electrostatic chuck 107. In some embodiments, the plurality of RF power delivery connection modules 209 can be defined as passive connections that provide direct electrical connection between the base plate 111 and the one or more clamp electrode(s) of the clamp electrode assembly 201. However, in other embodiments, some or all of the plurality of RF power delivery connection modules 209 can be defined to control an amplitude and/or frequency of RF signals transmitted from the base plate 111 to the one or more clamp electrode(s) of the clamp electrode assembly 201. Also, in some embodiments, individual ones of the plurality of RF power delivery connection modules 209 can be configured to control the amplitude and/or frequency of RF signals transmitted therethrough in real-time.

Figure 2B:
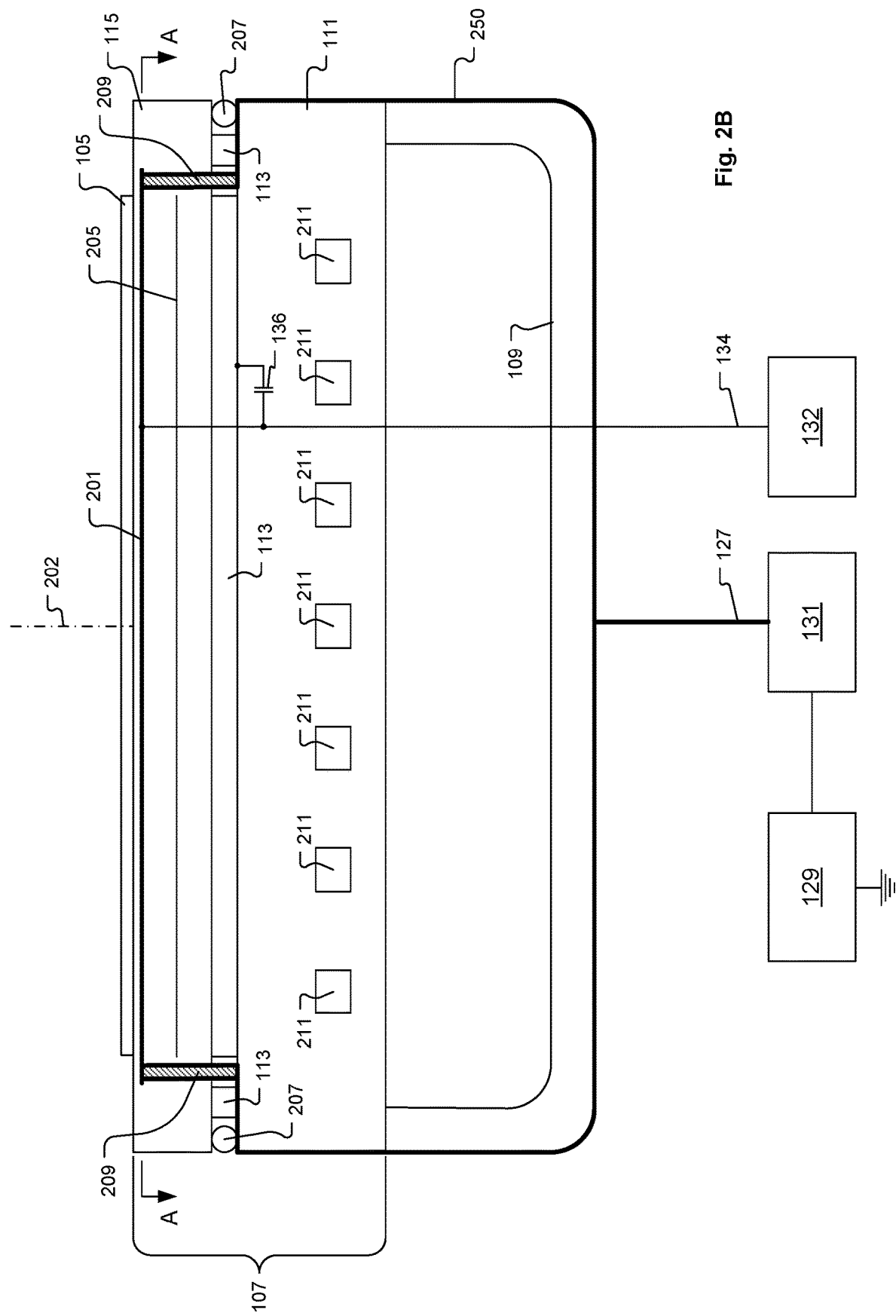
FIG. 2B shows the configuration of FIG. 2A with the RF signal transmission path indicated by the heavy solid line, in accordance with some embodiments of the present invention.

It should be understood that the base plate 111, the plurality of RF power delivery connection modules 209, and the clamp electrode assembly 201 together form a Faraday cage to direct RF power transmission around an internal volume of the electrostatic chuck 107 present between the top surface of the base plate 111 and the clamp electrode assembly 201 and within the circumference 221 about the ceramic layer 115 along which the plurality of RF power delivery connection modules 209 is located. FIG. 2B shows the configuration of FIG. 2A with the RF signal transmission path indicated by the heavy solid line 250, in accordance with some embodiments of the present invention. The RF signals are transmitted from the RF power source 129 through the matching module 131 through the connection 127 to the lower support structure 109. The RF signals then travel around the surface of lower support structure 109 to the base plate 111. The RF signals then travel along the surface of the base plate 111 up to the top surface of the base plate 111 and over to each of the plurality of RF power delivery connection modules 209 and then to the one or more clamp electrode(s) of the clamp electrode assembly 201.

By transmitting RF signals from the base plate 111 through the plurality of RF power delivery connection modules 209 to the one or more clamp electrode(s) of the clamp electrode assembly 201, the internal volume of the electrostatic chuck 107 is essentially unaffected by RF signal induced electrical fields. Also, RF signal filtering devices can be implemented at various locations where the plurality of RF power delivery connection modules 209 and other intentional RF conductors pass through other electrically conductive components within the electrostatic chuck 107, where it is desired that the other electrically conductive components not conduct RF signals. In this manner, the Faraday cage formed by the base plate 111, the plurality of RF power delivery connection modules 209, and the one or more clamp electrode(s) of the clamp electrode assembly 201, along with various RF filtering devices, protect and shield circuitry and connecting layers within the interior of the electrostatic chuck 107 from RF fields. Also, by causing the RF signal induced voltage to appear higher up in the electrostatic chuck 107 at the clamp electrode assembly 201, rather than at the base plate 111, there is less likelihood of inadvertently striking a plasma internally within the electrostatic chuck 107. Therefore, it is possible to put electronic components, e.g., heater circuitry, sensor circuitry, etc., within the interior volume of the electrostatic chuck 107 without them being exposed to adverse effects caused by RF current flowing through the entirety of the electrostatic chuck 207 structure.

Also, the Faraday cage formed by the base plate 111, the plurality of RF power delivery connection modules 209, and the one or more clamp electrode(s) of the clamp electrode assembly 201 provides for improved consistency in RF signal transmission to the substrate 105 for a broadband of RF signal frequencies, and provides for improved consistency in RF signal transmission to the substrate 105 that is independent of other internal circuitry and associated variations within the electrostatic chuck 107, thereby providing improved consistency in RF signal transmission to the substrate 105 from one electrostatic chuck 107 to another electrostatic chuck 107. Therefore, the Faraday cage formed by the base plate 111, the plurality of RF power delivery connection modules 209, and the clamp electrode assembly 201 provides for operation of different electrostatic chucks 107 with various RF signal frequencies and harmonics in a more uniform and consistent manner.

Additionally, the position of the clamp electrode assembly 201 near the top of the ceramic layer 115 provides for transmission of lower RF signal frequencies such as 400 kHz, 100 kHz, 55 kHz, among others. Also, the direct connection of the clamp electrode assembly 201 to the base plate 111 by way of the plurality of RF power delivery connection modules 209 enables pulsing of lower RF frequency signals, which may useful for certain plasma processing operations. Also, with the plurality of RF power delivery connection modules 209 configured to transmit higher RF current, it is possible to transmit higher RF current at lower RF signal frequency through the clamp electrode assembly 201 to the plasma processing region 119.

FIG. 4 shows a vertical cross-section view through one of the plurality of RF power delivery connection modules 209, in accordance with some embodiments of the present invention. The RF power delivery connection module 209 includes a first electrical connection 401 extending between the base plate 111 and an exposed embedded conductive segment 403 within the ceramic layer 115. Also, the RF power delivery connection module 209 includes a second electrical connection 405 extending between the exposed embedded conductive segment 403 through the ceramic layer 115 to the clamp electrode assembly 201, so as to make an electrical connection between the exposed embedded conductive segment 403 and the clamp electrode assembly 201. In some embodiments, the exposed embedded conductive segment 403 is planar shaped. In other embodiments, the exposed embedded conductive segment 403 is non-planar shaped, such as convex shaped, concave shaped, cylindrical shaped, among others. A portion 403A of the exposed embedded conductive segment 403 is exposed at a bottom of the ceramic layer 115 and is physically contacted by a member of the first electrical connection 401. In some embodiments, the exposed embedded conductive segment 403 can be plated to enable electrical connection with the first electrical connection 401.

The first electrical connection 401 and the second electrical connection 405 are configured to accommodate thermally induced expansion and contraction of supporting/surrounding/interfacing structures of the electrostatic chuck 107. In some embodiments, the first electrical connection 401 includes an electrically conductive pin 407 in compression against the exposed portion 403A of the exposed embedded conductive segment 403. In some embodiments, the first electrical connection 401 is electrically shorted to the base plate 111. In other embodiments, the first electrical connection 401 is electrically isolated from the base plate 111, but is disposed such that RF signals will be preferentially transmitted from the base plate 111 through the first electrical connection 401. In some embodiments, such as depicted in FIG. 4, the electrically conductive pin 407 is electrically connected to the base plate 111 to enable transmission of RF signals from the base plate 111 to the electrically conductive pin 407. Specifically, the electrically conductive pin 407 is disposed in electrical connection with its base structure 409, which is in turn disposed in electrical connection with the base plate 111. In this configuration, the RF signals travel along the outside surface of the base plate 111, across the top surface of the base plate 111, to the base structure 409, to the pin 407, up to the exposed embedded conductive segment 403, and through the second electrical connection 405 to the clamp electrode assembly 201. In some embodiments, the electrically conductive pin 407 includes a spring configured to compress the electrically conductive pin 407 against the exposed portion 403A of the exposed embedded conductive segment 403. Also, in some embodiments, the electrically conductive pin 407 is configured to transmit up to 30 amperes of RF current. However, it should be understood that in other embodiments, the electrically conductive pin 407 can be configured to transmit higher or lower amounts of RF current, as appropriate for the processes to be performed by the electrostatic chuck 107.

Additionally, in some embodiments, instead of using the electrically conductive pin 407, the connection between the base plate 111 and the exposed embedded conductive segment 403 is made using a brazed connection or a soldered connection. In some embodiments, regardless of the whether the first electrical connection 401 uses the electrically conductive pin 407, or the brazed connection, or the soldered connection, or some other type of connection as an RF conductor, the first electrical connection 401 is configured so that a distance traversed by the RF conductor between the ceramic layer 115 and the base plate 111 is as small as possible so as to minimize electrical impedance through the first electrical connection 401.

In some embodiments, the second electrical connection 405 includes one or more interior embedded conductive segments 411 within the ceramic layer 115. In some embodiments, each of the interior embedded conductive segments 411 is oriented substantially parallel to the clamp electrode assembly 201. Also, the second electrical connection 405 can include one or more vertical conductive structures 413 positioned to electrically connect the interior embedded conductive segments 411 to each other (in the case of multiple interior embedded conductive segments 411) and to the exposed embedded conductive segment 403 and to the clamp electrode assembly 201. In some embodiments, at least one of the vertical conductive structures 413 extends through the ceramic layer 115 between the exposed embedded conductive segment 403 and a lowest one of the interior embedded conductive segments 411, and at least one of the vertical conductive structures 413 extends through the ceramic layer 115 between a highest one of the interior embedded conductive segments 411 and the clamp electrode assembly 201, and at least one of the vertical conductive structures 413 extends through the ceramic layer 115 between each vertically neighboring set of two of the interior embedded conductive segments 411 when present.

It should be appreciated that use of the interior embedded conductive segments 411 enables fabrication of the ceramic layer 115 in a stacked manner, with the vertical conductive structures 413 used to connect to the interior embedded conductive segments 411. Also, it should be understood that the vertical conductive structures 413 can be located at different locations on opposite sides of a given interior embedded conductive segment 411. In this manner, electrical connections within the second electrical connection 405 of the RF power delivery connection module 209 can be made at different vertical locations and at different horizontal locations. Also, the vertical conductive structures 413 can be disposed in a redundant manner within a given RF power delivery connection module 209. For example, in some embodiments, in a given one of the RF power delivery connection modules 209, at least four vertical conductive structures 413 extend through the ceramic layer 115 between the exposed embedded conductive segment 403 and a lowest one of the interior embedded conductive segments 411, and at least four vertical conductive structures 413 extend through the ceramic layer 115 between a highest one of the interior embedded conductive segments 411 and the clamp electrode assembly 201, and at least four vertical conductive structures 413 extend through the ceramic layer 115 between each vertically neighboring set of two of the interior embedded conductive segments 411 when present.

Figure 5:
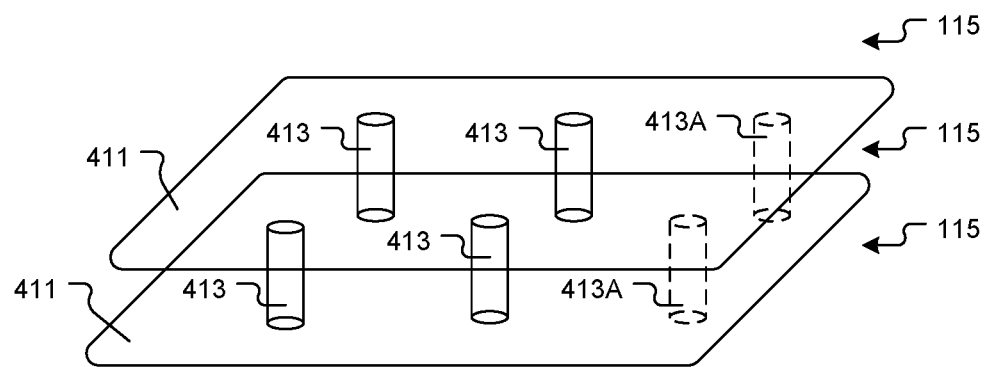
FIG. 5 shows an example of using multiple vertical conductive structures in a redundant manner between a neighboring set of two of the interior embedded conductive segments, in accordance with some embodiments of the present invention.

FIG. 5 shows an example of using four vertical conductive structures 413 in a redundant manner between a neighboring set of two of the interior embedded conductive segments 411, in accordance with some embodiments of the present invention. It should be understood that the depiction of four vertical conductive structures 413 in the example of FIG. 5 is provided by way of example. In other embodiments, either more or less than four vertical conductive structures 413 can be disposed between a neighboring set of two of the interior embedded conductive segments 411. For example, FIG. 5 shows the option for having additional vertical conductive structures 413A. In various embodiments, the quantity of vertical conductive structures 413 disposed between a neighboring set of two of the interior embedded conductive segments 411 in a given RF power delivery connection module 209 can be determined by the choice of material(s) used to fabricate the vertical conductive structures 413 and/or interior embedded conductive segments 411 and the electrical capacity of those chosen material(s).

Figure 6A:
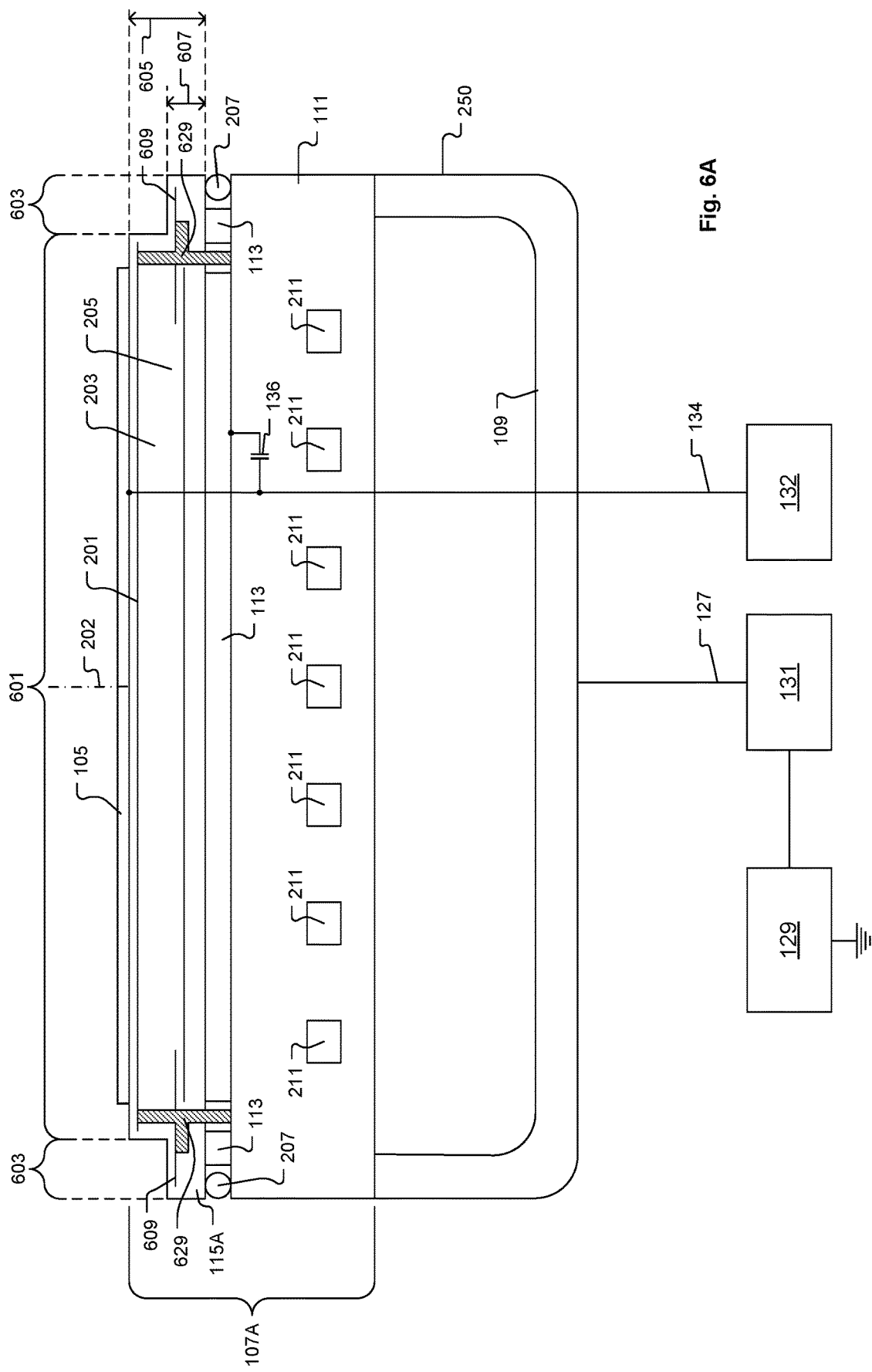
FIG. 6A shows an electrostatic chuck that includes a ceramic layer having a stepped configuration, in accordance with some embodiments of the present invention.
Figure 6B:
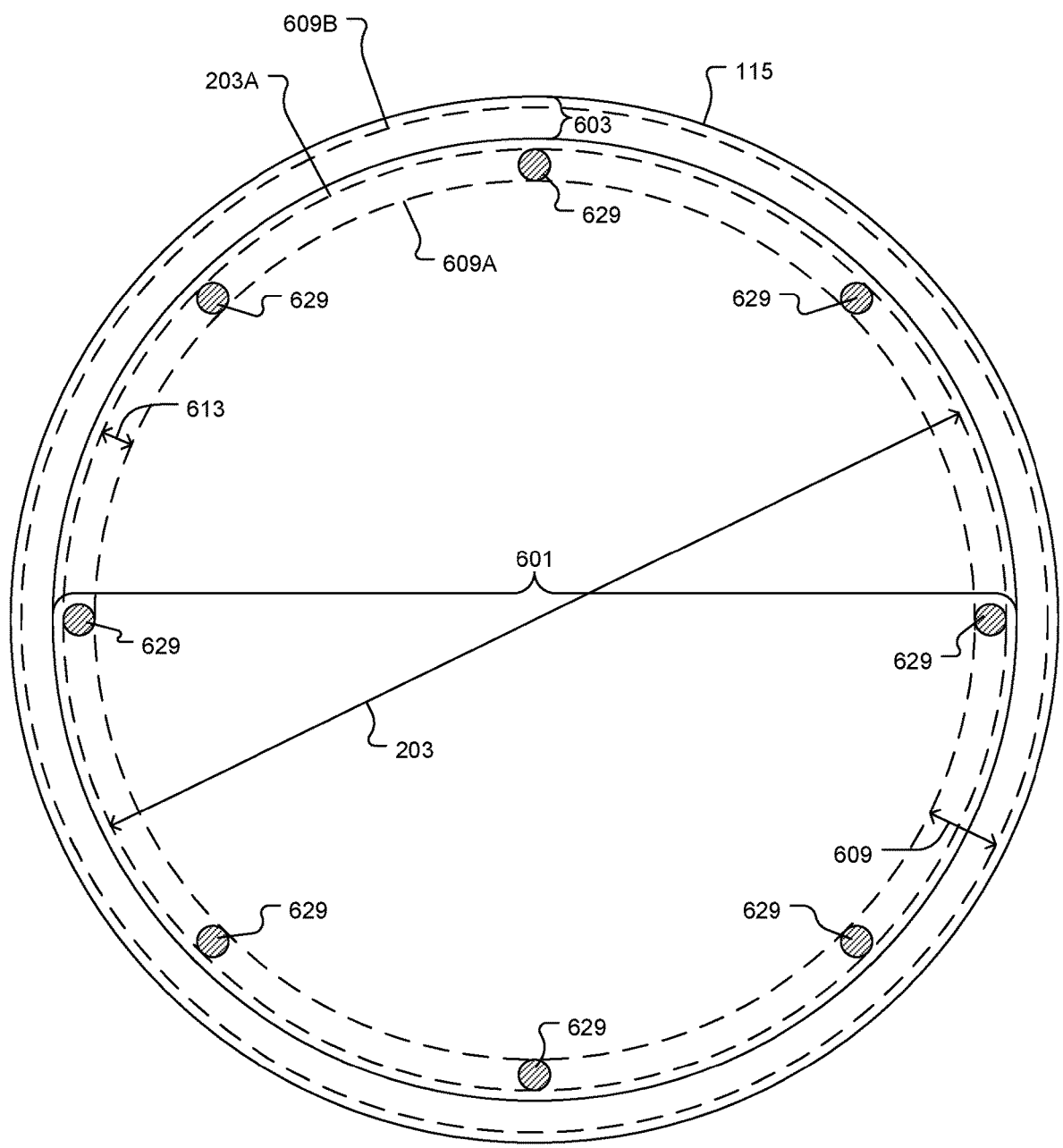
FIG. 6B shows a top view of the ceramic layer, in accordance with some embodiments of the present invention.

FIG. 6A shows an electrostatic chuck 107A that includes a ceramic layer 115A having a stepped configuration, in accordance with some embodiments of the present invention. FIG. 6B shows a top view of the ceramic layer 115A, in accordance with some embodiments of the present invention. The ceramic layer 115A includes a central region 601 and a peripheral region 603. The central region 601 includes the area configured to support the substrate 105. The peripheral region 603 is configured to circumscribe the central region 601. The ceramic layer 115A has a bottom surface that extends in a substantially uniform planar manner across both the central region 601 and the peripheral region 603. The central region 601 has a first overall thickness 605 as measured perpendicular to the bottom surface of the ceramic layer 115A. The peripheral region 603 has a second overall thickness 607 as measured perpendicular to the bottom surface of the ceramic layer 115A. The second overall thickness 607 is less than the first overall thickness 605, thereby giving the ceramic layer 115A the stepped configuration at its outer radial periphery. Also, an entirety of the clamp electrode assembly 201 is positioned within the central region 601 of the ceramic layer 115A at a location just below top surface of the ceramic layer 115A. And, the peripheral region 603 of the ceramic layer 115A includes a portion of a perimeter RF power delivery electrode 609. The perimeter RF power delivery electrode 609 also extends into the central region 601 of the ceramic layer 115A underneath an outer portion of the clamp electrode assembly 201.

The perimeter RF power delivery electrode 609 is formed within the ceramic layer 115A at a vertical location within the ceramic layer 115A below the clamp electrode assembly 201. The perimeter RF power delivery electrode 609 has an annular shape defined by a top surface, a bottom surface, an inner edge 609A, and an outer edge 609B. In some embodiments, the top and bottom surfaces of the perimeter RF power delivery electrode 609 are oriented substantially parallel to the top surface of the ceramic layer 115A. The inner edge 609A of the perimeter RF power delivery electrode 609 is positioned radially closer to the centerline 202 of the ceramic layer 115A than an outer edge 203A of the clamp electrode assembly 201, such that an overlap 613 exists between the clamp electrode assembly 201 and the perimeter RF power delivery electrode 609. Again, the centerline 202 of the ceramic layer 115A is considered to extend perpendicular to the top surface of the ceramic layer 115A at a centerpoint of the top surface of the ceramic layer 115A. The outer edge 609B of the perimeter RF power delivery electrode 609 is positioned farther from the centerline 202 of the ceramic layer 115A than the outer edge 203A of the clamp electrode assembly 201. The extension of the perimeter RF power delivery electrode 609 radially outward beyond the clamp electrode assembly 201 allows for transmission of RF signals at locations around the radial perimeter of the substrate 105, which can be used to improve processing performance at the radial edge of the substrate 105 in some processing applications. The perimeter RF power delivery electrode 609 provides an extension of the RF coupling to the plasma beyond the outer radial perimeter of the substrate 105 so as to improve process performance at the outermost regions and edge of the substrate 105.

To provide for electrical connection of the perimeter RF power delivery electrode 609 and the clamp electrode assembly 201 to the base plate 111, a plurality of RF power delivery connection modules 629 is distributed in a substantially uniform manner about a perimeter of the ceramic layer 115A, with each of the plurality of RF power delivery connection modules 629 providing a low impedance transmission path for RF signals between the base plate 111 and the perimeter RF power delivery electrode 609 and the clamp electrode assembly 201. The plurality of RF power delivery connection modules 629 can be distributed around the periphery of the ceramic layer 115A in the same manner as discussed herein with regard to distribution of the plurality of RF power delivery connection modules 209 about the periphery of the ceramic layer 115.

Figure 6C:
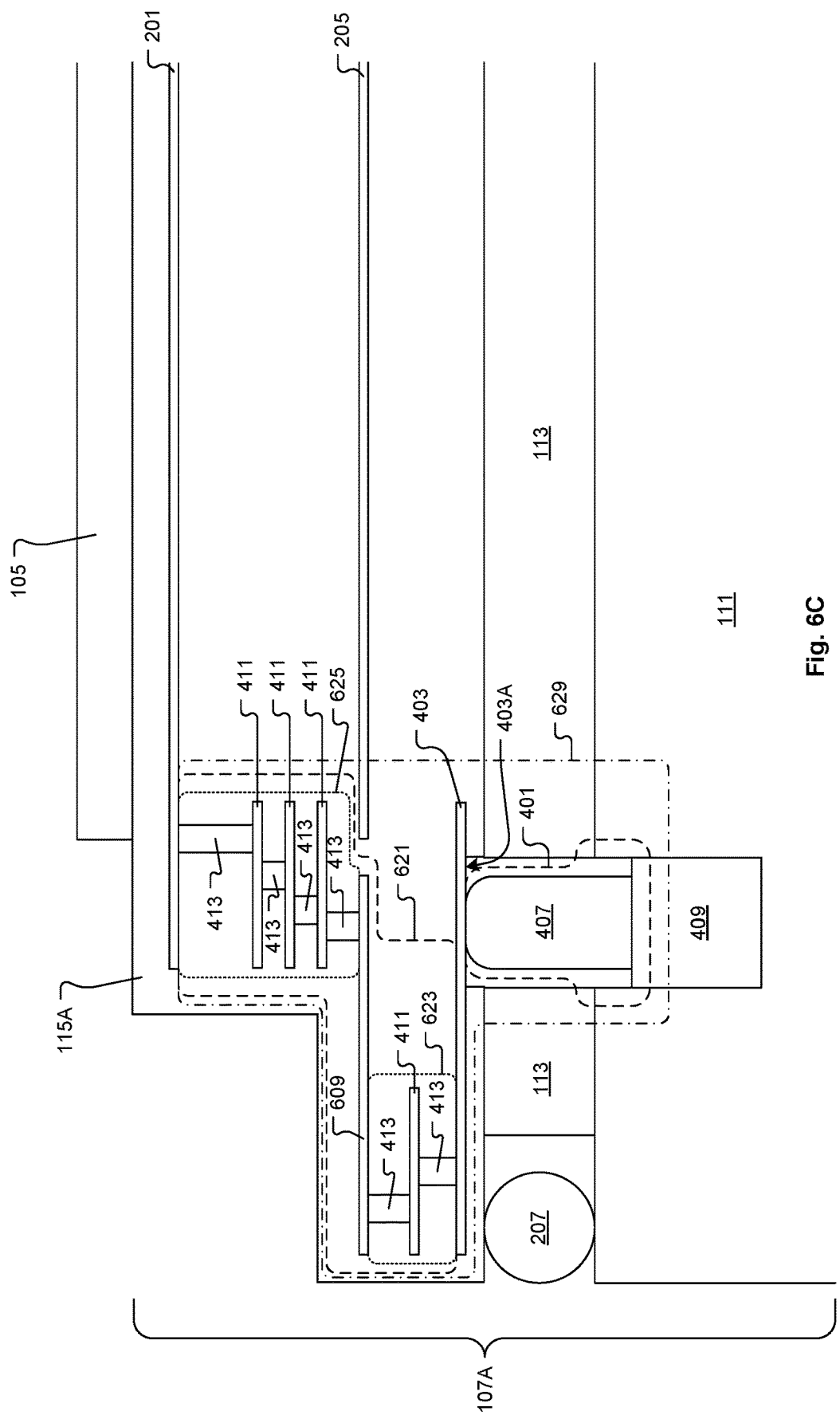
FIG. 6C shows a vertical cross-section view through one of the plurality of RF power delivery connection modules, in accordance with some embodiments of the present invention.

FIG. 6C shows a vertical cross-section view through one of the plurality of RF power delivery connection modules 629, in accordance with some embodiments of the present invention. In some embodiments, each of the RF power delivery connection modules 629 includes the first electrical connection 401 extending between the base plate 111 and the exposed embedded conductive segment 403 within the ceramic layer 115A, with the portion 403A of the exposed embedded conductive segment 403 being exposed at a bottom of the ceramic layer 115A. As previously discussed with regard to FIG. 4, the first electrical connection 401 can be formed by the electrically conductive pin 407 in some embodiments. Alternatively, in other embodiments, the first electrical connection 401 can be formed by a brazed or soldered connection extending between the base plate 111 and the exposed embedded conductive segment 403.

Each of the RF power delivery connection modules 629 includes a second electrical connection 621 extending between the exposed embedded conductive segment 403 through the ceramic layer 115A to the clamp electrode assembly 201. The second electrical connection 621 includes a lower electrical connection 623 extending through the ceramic layer 115A from the exposed embedded conductive segment 403 to the perimeter RF power delivery electrode 609. The second electrical connection 621 also includes and an upper electrical connection 625 extending through the ceramic layer 115A from the perimeter RF power delivery electrode 609 to the clamp electrode assembly 201. The lower electrical connection 623 can be formed using a number of interior embedded conductive segments 411 and vertical conductive structures 413, in a manner similar to that discussed with regard to the second electrical connection 405 of FIG. 4. In the example of FIG. 6C, one interior embedded conductive segments 411 and two vertical conductive structures 413 are used to form the lower electrical connection 623 extending from the exposed embedded conductive segment 403 to the perimeter RF power delivery electrode 609. Similarly, the upper electrical connection 625 can be formed using a number of interior embedded conductive segments 411 and vertical conductive structures 413, in a manner similar to that discussed with regard to the second electrical connection 405 of FIG. 4. In the example of FIG. 6C, three interior embedded conductive segments 411 and four vertical conductive structures 413 are used to form the upper electrical connection 625 extending from the perimeter RF power delivery electrode 609 to the clamp electrode assembly 201.

In some embodiments, such as that shown in FIG. 6C, the RF signals are transmitted through the perimeter RF power delivery electrode 609 to the clamp electrode assembly 201. However, in other embodiments, the RF signals can be first transmitted to the clamp electrode assembly 201 and then through the clamp electrode assembly 201 to the perimeter RF power delivery electrode 609. Also, in some embodiments, the RF signals can be transmitted from the base plate 111 to the perimeter RF power delivery electrode 609 without first traversing through the clamp electrode assembly 201, and the RF signals can be transmitted from the base plate 111 to the clamp electrode assembly 201 without first traversing through the perimeter RF power delivery electrode 609.

Also, in some embodiments, the perimeter RF power delivery electrode 609 can be electrically isolated from the clamp electrode assembly 201, with a portion of the ceramic layer 115A acting as an insulator therebetween. In these embodiments, each of the perimeter RF power delivery electrode 609 and the clamp electrode assembly 201 can be independently connected to receive RF signals directly from the base plate 111. Also, in this configuration in some embodiments, the RF signal transmission pathways to each of the perimeter RF power delivery electrode 609 and the clamp electrode assembly 201 can be independently controlled, so as to provide for independent control of RF current delivered to the periphery of the ceramic layer 115A versus RF current delivered to the substrate 105 supporting central region 601 of the ceramic layer 115A. Therefore, in various embodiments, having both the perimeter RF power delivery electrode 609 and the clamp electrode assembly 201 will provide for application of additional RF signal frequencies at the perimeter RF power delivery electrode 609, but not at the clamp electrode assembly 201, vice-versa, thereby providing increased operational flexibility for substrate 105 edge processing.

Figure 6D:
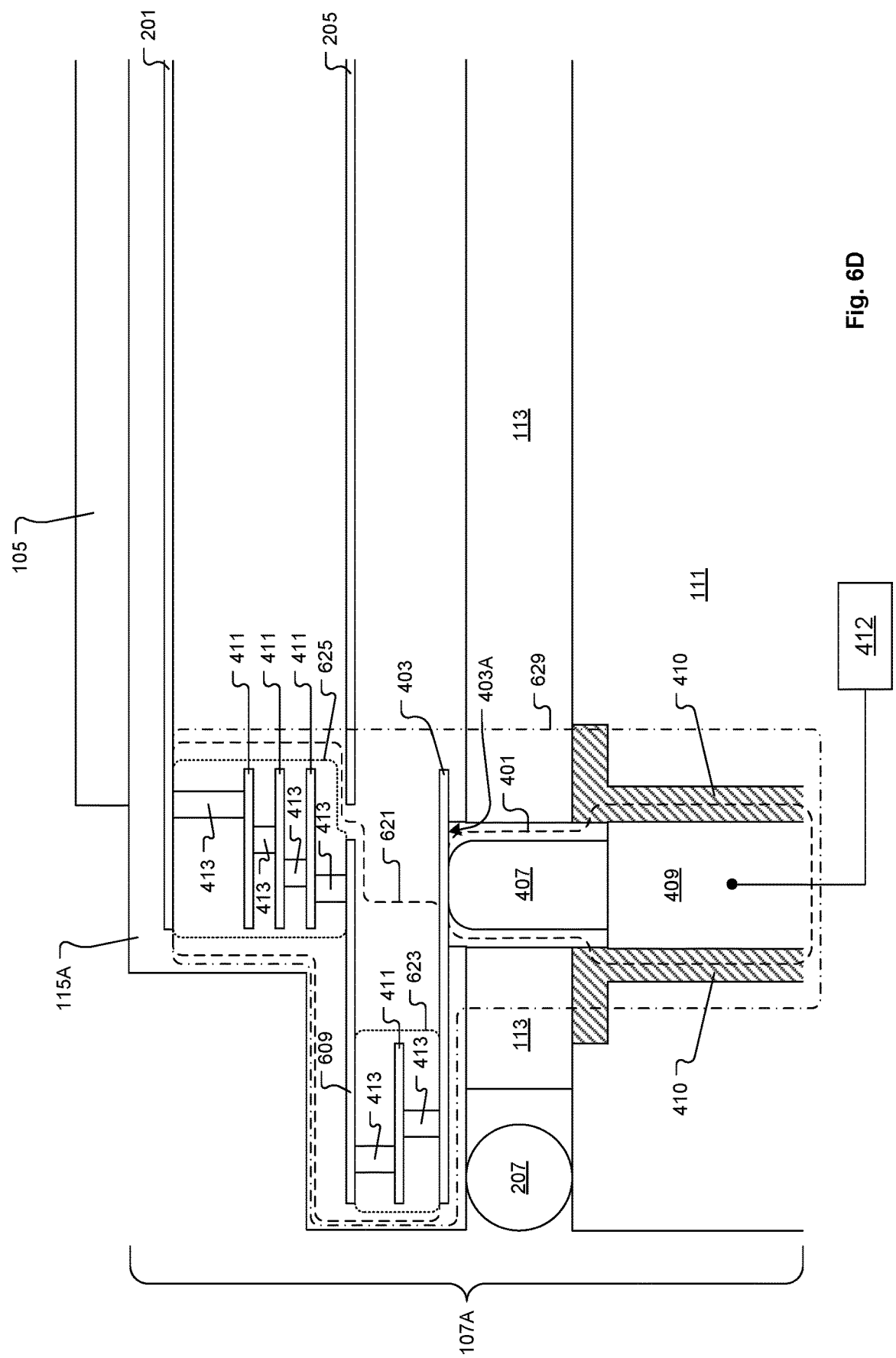
FIG. 6D shows a vertical cross-section view through one of the plurality of RF power delivery connection modules in which the first electrical connection is electrically isolated from the base plate, such that independently controlled RF signals can be transmitted to the plurality of RF power delivery connection modules and the base plate, respectively, in accordance with some embodiments of the present invention.

FIG. 6D shows a vertical cross-section view through one of the plurality of RF power delivery connection modules 629 in which the first electrical connection 401 is electrically isolated from the base plate 111, such that independently controlled RF signals can be transmitted to the plurality of RF power delivery connection modules 629 and the base plate 111, respectively, in accordance with some embodiments of the present invention. In the example of FIG. 6D, the base structure 409 of the electrically conductive pin 407 is disposed within an electrically insulating member 410, such as a dielectric sleeve, so that the base structure 409 is electrically isolated from the base plate 111. The base structure 409 of the electrically conductive pin 407 is connected to an RF power source 412, by way of appropriate RF impedance matching circuitry. In this configuration, RF signals generated by the RF power source 412 are conducted to the base structure 409, and from the base structure 409 to the electrically conductive pin 407, and from the electrically conductive pin 407 to the exposed embedded conductive segment 403, without being conducted through the base plate 111. In some embodiments, the RF power source 412 is connected to an RF control module, such that RF signals transmitted from the RF power source 412 to the base structure 409 of the electrically conductive pin 407 are controlled by the RF control module.

FIG. 7 shows a flowchart of a method for manufacturing an electrostatic chuck (107/107A), in accordance with some embodiments of the present invention. The method includes an operation 701 for forming a ceramic layer (115/115A) having a top surface including an area configured to support a substrate (105). The operation 701 includes positioning a clamp electrode assembly (201) within the ceramic layer (115/115A) in an orientation substantially parallel to the top surface of the ceramic layer (115/115A) and at an upper location within the ceramic layer (115/115A) such that a region of the ceramic layer (115/115A) between the clamp electrode assembly (201) and the top surface of the ceramic layer (115/115A) is substantially free of other electrically conductive material. The clamp electrode assembly (201) is configured to extend horizontally through the ceramic layer (115/115A) to at least span an area underlying the area of the top surface of the ceramic layer (115/115A) that is configured to support the substrate (105). The operation 701 includes positioning a plurality of RF power delivery connection modules (209/629) in a substantially uniformly distributed manner about a perimeter of the ceramic layer (115/115A). Each of the plurality of RF power delivery connection modules (209/629) is configured to form an electrical connection from a base plate (111) to the clamp electrode assembly (201) at its respective location so as to form an RF power transmission path from the base plate (111) to the clamp electrode assembly (201) at its respective location. The method also includes an operation 703 for attaching the ceramic layer (115/115A) to the base plate (111) using a bond layer (113) disposed between the base plate (111) and the ceramic layer (115/115A).

As discussed herein, the base plate 111, the plurality of RF power delivery connection modules 209/629, and the clamp electrode assembly 201 together form a Faraday cage to direct RF power transmission around an internal volume of the electrostatic chuck 107/107A present between a top surface of the base plate 111 and the clamp electrode assembly 201 and within a circumference about the ceramic layer 115/115A along which the plurality of RF power delivery connection modules 209/629 is located. With this Faraday cage serving to conduct RF currents around the internal volume of the electrostatic chuck 107/107A, internal components and circuitry within the internal volume of the electrostatic chuck 107/107A are protected from RF induced damage. Also, the Faraday cage configuration serves to delivery the RF signals to the upper region of the electrostatic chuck 107/107A in a uniform manner, which translates into a more uniform plasma density across the substrate 105. Additionally, because the clamp electrode assembly 201 is located near the top surface of the electrostatic chuck 107/107A in the Faraday cage configuration, it is possible to reliably deliver lower frequency RF signals, e.g., 2 MHz down to 400 kHz or less, to the plasma processing region 119. And, because the lower frequency RF signals are transmitted around the internal volume of the electrostatic chuck 107/107A, there is a significantly reduced likelihood of parasitic discharge within the internal volume of the electrostatic chuck 107/107A.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. An electrostatic chuck, comprising:
    a base plate formed of an electrically conductive material;
    a ceramic layer attached to a top surface of the base plate using a bond layer disposed between the base plate and the ceramic layer, the ceramic layer having a top surface including an area configured to support a substrate;
    a clamp electrode assembly positioned within the ceramic layer in an orientation substantially parallel to the top surface of the ceramic layer and at an upper location within the ceramic layer such that a region of the ceramic layer between the clamp electrode assembly and the top surface of the ceramic layer is substantially free of other electrically conductive material, wherein the clamp electrode assembly is configured to extend horizontally through the ceramic layer to at least span an area underlying the area of the top surface of the ceramic layer that is configured to support the substrate; and
    a plurality of RF power delivery connection modules distributed in a substantially uniform manner about a perimeter of the ceramic layer, each of the plurality of RF power delivery connection modules configured to form an electrical connection from the base plate to the clamp electrode assembly at its respective location so as to form an RF power transmission path from the base plate to the clamp electrode assembly at its respective location, wherein the base plate, the plurality of RF power delivery connection modules, and the clamp electrode assembly together form a Faraday cage to direct RF power transmission around an internal volume of the electrostatic chuck, and
    wherein each of the plurality of RF power delivery connection modules includes a first electrical connection extending from the base plate to an exposed embedded conductive segment within the ceramic layer, wherein a portion of the exposed embedded conductive segment is exposed at a bottom of the ceramic layer, and wherein each of the plurality of RF power delivery connection modules includes a second electrical connection extending from the exposed embedded conductive segment through the ceramic layer to the clamp electrode assembly.

2. The electrostatic chuck as recited in claim 1, wherein the first electrical connection includes an electrically conductive pin in compression against the exposed portion of the exposed embedded conductive segment, wherein the electrically conductive pin is electrically connected to the base plate to enable transmission of RF signals from the base plate to the electrically conductive pin.

3. The electrostatic chuck as recited in claim 2, wherein the electrically conductive pin is configured to transmit up to 30 amperes of electrical current.

4. The electrostatic chuck as recited in claim 1, wherein the second electrical connection includes one or more interior embedded conductive segments within the ceramic layer, wherein each of the one or more interior embedded conductive segments is oriented substantially parallel to the top surface of the ceramic layer, and wherein the second electrical connection includes one or more vertical conductive structures positioned to electrically connect the one or more interior embedded conductive segments to each other and to the exposed embedded conductive segment and to the clamp electrode assembly.

5. The electrostatic chuck as recited in claim 4, wherein at least one of the vertical conductive structures extends through the ceramic layer between the exposed embedded conductive segment and a lowest one of the interior embedded conductive segments, and wherein at least one of the vertical conductive structures extends through the ceramic layer between a highest one of the interior embedded conductive segments and the clamp electrode assembly, and wherein at least one of the vertical conductive structures extends through the ceramic layer between each vertically neighboring set of two of the interior embedded conductive segments when present.

6. The electrostatic chuck as recited in claim 4, wherein at least four of the vertical conductive structures extends through the ceramic layer between the exposed embedded conductive segment and a lowest one of the interior embedded conductive segments, and wherein at least four of the vertical conductive structures extends through the ceramic layer between a highest one of the interior embedded conductive segments and the clamp electrode assembly, and wherein at least four of the vertical conductive structures extends through the ceramic layer between each vertically neighboring set of two of the interior embedded conductive segments when present.

7. The electrostatic chuck as recited in claim 1, wherein the plurality of RF power delivery connection modules includes eight RF power delivery connection modules positioned near a periphery of the ceramic layer, with each of the eight RF power delivery connection modules separated from each adjacent one of the eight RF power delivery connection modules by an angle of about 45 degrees as measured about a centerline of the ceramic layer extending perpendicular to the top surface of the ceramic layer.

8. The electrostatic chuck as recited in claim 1, wherein the clamp electrode assembly is formed as a single electrode configured to operate in a monopolar mode.

9. The electrostatic chuck as recited in claim 1, wherein the clamp electrode assembly is formed as two electrodes configured to operate in a bipolar mode.

10. The electrostatic chuck as recited in claim 1, further comprising:

a perimeter RF power delivery electrode formed within the ceramic layer at a vertical location within the ceramic layer below the clamp electrode assembly, the perimeter RF power delivery electrode having an annular shape defined by a top surface, a bottom surface, an inner edge, and an outer edge, the top and bottom surfaces of the perimeter RF power delivery electrode oriented substantially parallel to the top surface of the ceramic layer, the inner edge of the perimeter RF power delivery electrode positioned radially closer to a centerline of the ceramic layer than an outer edge of the primary RF power delivery electrode, wherein the centerline of the ceramic layer extends perpendicular to the top surface of the ceramic layer, and wherein the outer edge of the perimeter RF power delivery electrode is positioned farther from the centerline of the ceramic layer than the outer edge of the clamp electrode assembly.

11. The electrostatic chuck as recited in claim 10, wherein each of the plurality of RF power delivery connection modules includes a first electrical connection extending between the base plate and an exposed embedded conductive segment within the ceramic layer, wherein a portion of the exposed embedded conductive segment is exposed at a bottom of the ceramic layer, and wherein each of the plurality of RF power delivery connection modules includes a second electrical connection extending from the exposed embedded conductive segment through the ceramic layer to the clamp electrode assembly, wherein the second electrical connection includes a lower electrical connection extending through the ceramic layer from the exposed embedded conductive segment to the perimeter RF power delivery electrode and an upper electrical connection extending through the ceramic layer from the perimeter RF power delivery electrode to the clamp electrode assembly.

12. The electrostatic chuck as recited in claim 11, wherein the ceramic layer includes a central region and a peripheral region, the central region including the area configured to support the substrate, the peripheral region configured to circumscribe the central region, the ceramic layer having a bottom surface that extends in a planar manner across both the central region and the peripheral region, the central region having a first overall thickness as measured perpendicular to the bottom surface of the ceramic layer, the peripheral region having a second overall thickness as measured perpendicular to the bottom surface of the ceramic layer, wherein the second overall thickness is less than the first overall thickness, wherein an entirety of the clamp electrode assembly is positioned within the central region, and wherein the peripheral region includes a portion of the perimeter RF power delivery electrode.

13. The electrostatic chuck as recited in claim 1, wherein the region of the ceramic layer between the clamp electrode assembly and the top surface of the ceramic layer being substantially free of other electrically conductive material corresponds to the region of the ceramic layer between the clamp electrode assembly and the top surface of the ceramic layer including no electrically conductive material, or to the region of the ceramic layer between the clamp electrode assembly and the top surface of the ceramic layer including sparsely distributed electrically conductive material that does not interfere with transmission of RF signals, or to the region of the ceramic layer between the clamp electrode assembly and the top surface of the ceramic layer including some electrically conductive material that is electrically isolated from other surrounding electrically conductive materials, or to the region of the ceramic layer between the clamp electrode assembly and the top surface of the ceramic layer including electrically conductive material of a thickness small enough to not shield RF signals.

14. A system for plasma processing, comprising:
a processing chamber;
an electrostatic chuck positioned within the processing chamber, the electrostatic chuck including
a base plate formed of an electrically conductive material,
a ceramic layer attached to a top surface of the base plate using a bond layer disposed between the base plate and the ceramic layer, the ceramic layer having a top surface including an area configured to support a substrate,
a clamp electrode assembly positioned within the ceramic layer in an orientation substantially parallel to the top surface of the ceramic layer and at an upper location within the ceramic layer such that a region of the ceramic layer between the clamp electrode assembly and the top surface of the ceramic layer is substantially free of other electrically conductive material, wherein the clamp electrode assembly is configured to extend horizontally through the ceramic layer to at least span an area underlying the area of the top surface of the ceramic layer that is configured to support the substrate, and
a plurality of RF power delivery connection modules distributed in a substantially uniform manner about a perimeter of the ceramic layer, each of the plurality of RF power delivery connection modules configured to form an electrical connection from the base plate to the clamp electrode assembly at its respective location so as to form an RF power transmission path from the base plate to the clamp electrode assembly at its respective location; and
an RF power source connected to transmit RF power to the base plate of the electrostatic chuck,
wherein the base plate, the plurality of RF power delivery connection modules, and the clamp electrode assembly of the electrostatic chuck together form a Faraday cage to direct RF power transmission around an internal volume of the electrostatic chuck, and
wherein each of the plurality of RF power delivery connection modules includes a first electrical connection extending from the base plate to an exposed embedded conductive segment within the ceramic layer, wherein a portion of the exposed embedded conductive segment is exposed at a bottom of the ceramic layer, and wherein each of the plurality of RF power delivery connection modules includes a second electrical connection extending from the exposed embedded conductive segment through the ceramic layer to the clamp electrode assembly.

15. The system for plasma processing as recited in claim 14, wherein the clamp electrode assembly is formed as a single electrode configured to operate in a monopolar mode.

16. The system for plasma processing as recited in claim 15, further comprising:
a clamping power source electrically connected to the clamp electrode assembly, the clamping power source configured to supply electrical current to the single electrode of the clamp electrode assembly in a manner that causes electrostatic clamping of the substrate to the top surface of the ceramic layer when the substrate is present.

17. The system for plasma processing as recited in claim 15, wherein the clamp electrode assembly is formed as two electrodes configured to operate in a bipolar mode.

18. The system for plasma processing as recited in claim 17, further comprising:
a clamping power source electrically connected to the clamp electrode assembly, the clamping power source configured to supply electrical current to the two electrodes of the clamp electrode assembly in a manner that causes electrostatic clamping of the substrate to the top surface of the ceramic layer when the substrate is present.

* * * * *